(12) United States Patent
Laurent et al.

(10) Patent No.: US 12,274,003 B2
(45) Date of Patent: Apr. 8, 2025

(54) ELECTRONIC DEVICE

(71) Applicant: STMicroelectronics (Grenoble 2) SAS, Grenoble (FR)

(72) Inventors: Patrick Laurent, Tullins (FR); Jean-Michel Riviere, Froges (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 266 days.

(21) Appl. No.: 17/961,911

(22) Filed: Oct. 7, 2022

(65) Prior Publication Data
US 2023/0114469 A1    Apr. 13, 2023

(30) Foreign Application Priority Data

Oct. 8, 2021    (FR) ...................................... 2110658

(51) Int. Cl.
*H05K 1/02*    (2006.01)
*B81B 7/02*    (2006.01)
(Continued)

(52) U.S. Cl.
CPC ............ *H05K 1/144* (2013.01); *H05K 1/028* (2013.01); *H05K 1/115* (2013.01); *H05K 1/181* (2013.01);
(Continued)

(58) Field of Classification Search
CPC ........ H05K 1/02; H05K 1/0275; H05K 1/028; H05K 1/115; H05K 1/144; H05K 1/181;
(Continued)

(56) References Cited

U.S. PATENT DOCUMENTS 5,070,258 A * 12/1991 Izumi ............... G01R 31/31701
361/737
5,134,546 A *  7/1992 Izumi ................... H05K 5/0043
361/736
(Continued)

FOREIGN PATENT DOCUMENTS

CN       111123291 A       5/2020

OTHER PUBLICATIONS

INPI Search Report and Written Opinion for priority application, FR 2110658, report dated Oct. 14, 2022, 10 pgs.

*Primary Examiner* — Xiaoliang Chen
(74) *Attorney, Agent, or Firm* — Crowe & Dunlevy LLC

(57) ABSTRACT

A device includes comprising first and second printed circuit boards. Walls couple the first and second printed circuit boards to each other and define a first cavity between the first and second printed circuit boards. Electric conductors associated with the walls electrically connect the first and second printed circuit boards. An integrated circuit chip is mounted to a first surface of the first integrated circuit board in the first cavity. The integrated circuit chip is electrically connected to conductive tracks of the first surface of the first printed circuit board. Surface-mounted components are mounted on top of and in contact with conductive tracks of a first surface of the second printed circuit board. The first surfaces of the first and second printed circuit boards are arranged facing towards each other. The first and second printed circuit boards may form rigid components of a flex-rigid type printed circuit board.

21 Claims, 3 Drawing Sheets

(51) Int. Cl.
*H01L 23/13* (2006.01)
*H01L 23/24* (2006.01)
*H01L 23/552* (2006.01)
*H01L 23/66* (2006.01)
*H04R 19/04* (2006.01)
*H05K 1/11* (2006.01)
*H05K 1/14* (2006.01)
*H05K 1/18* (2006.01)
*G01S 7/481* (2006.01)

(52) U.S. Cl.
CPC ...... *G01S 7/4816* (2013.01); *H05K 2201/042* (2013.01); *H05K 2201/10151* (2013.01)

(58) Field of Classification Search
CPC ... H05K 2201/042; H05K 2201/10151; H04R 19/04; H04R 19/005; G01S 7/4816; B81B 7/0064; B81B 7/02; B81C 1/00833; H01L 21/565; H01L 21/4846; H01L 23/13; H01L 23/24; H01L 23/66; H01L 23/552; H01L 23/3017; H01L 23/3128; H01L 23/4951; H01L 23/5385; H01L 23/49575; H01L 23/49531; H01L 23/49805; H01L 23/49816
USPC ....... 361/749, 709, 736, 761, 784, 796, 804, 361/818, 820; 439/67, 496; 174/384, 174/541, 558, 564; 381/365
See application file for complete search history.

(56) References Cited

U.S. PATENT DOCUMENTS

| | | | | |
|---|---|---|---|---|
| 5,295,044 | A * | 3/1994 | Araki | H05K 7/023 257/E23.172 |
| 6,335,669 | B1 * | 1/2002 | Miyazaki | H01L 25/0657 257/723 |
| 6,398,560 | B1 * | 6/2002 | Mizuno | G02F 1/133308 439/496 |
| 6,674,159 | B1 | 1/2004 | Peterson et al. | |
| 6,861,737 | B1 * | 3/2005 | Jeong | H01L 24/05 257/774 |
| 9,807,517 | B2 * | 10/2017 | Chen | B81B 7/02 |
| 2001/0005045 | A1 * | 6/2001 | Shen | H01L 23/49531 257/E23.036 |
| 2003/0073266 | A1 * | 4/2003 | Takahashi | H01L 21/565 257/E25.023 |
| 2003/0205801 | A1 * | 11/2003 | Baik | H01L 23/4951 257/737 |
| 2004/0264156 | A1 * | 12/2004 | Ajioka | H01L 23/552 257/E25.031 |
| 2008/0278922 | A1 * | 11/2008 | Wimmer | G06F 21/86 361/784 |
| 2016/0025855 | A1 | 1/2016 | Camarri et al. | |
| 2016/0381466 | A1 * | 12/2016 | Chen | B81C 1/00833 381/365 |
| 2022/0404196 | A1 * | 12/2022 | Chen | H04R 1/04 |

* cited by examiner

ELECTRONIC DEVICE

PRIORITY CLAIM

This application claims the priority benefit of French Application for Patent No. 2110658, filed on Oct. 8, 2021, the content of which is hereby incorporated by reference in its entirety to the maximum extent allowable by law.

TECHNICAL FIELD

The present disclosure generally concerns electronic devices and, more particularly, concerns time-of-flight sensors.

BACKGROUND

Electronic devices comprising at least one integrated circuit chip and various components such as, for example, resistors or capacitors, are known. These devices generally comprise packages having the chip(s) of the device and the electronic components of the device arranged and interconnected therein.

These known electronic devices may further comprise optical elements, for example, optical diffusers provided with conductive traces, which may require being electrically connected to a chip of the device.

The forming of these known devices poses various problems, for example, as concerns the forming of the package and the way of interconnecting together the electronic elements of the device. Further, these known devices may be bulky.

There is a need to overcome all or part of the disadvantages of known electronic devices comprising a package and a plurality of electronic elements assembled in the package and interconnected to one another, for example, when these devices are time-of-flight sensors.

SUMMARY

An embodiment overcomes all or part of the disadvantages of known electronic devices comprising a package and a plurality of electronic components assembled in the package and interconnected to one another.

For example, an embodiment overcomes all or part of the disadvantages known time-of-flight sensors.

An embodiment provides a device comprising: first and second printed circuit boards; walls coupling said boards together and defining a first cavity between said boards; electric conductors arranged in or along said walls and electrically connecting the boards together; an integrated circuit chip resting on a first surface of the first board in the first cavity and being electrically connected to conductive tracks of the first surface of the first board; and surface-mounted components resting on top of and in contact with conductive tracks of a first surface of the second board, the first surfaces being arranged in front of each other.

According to an embodiment, the first and second printed circuit boards are rigid.

According to an embodiment, the device comprises a third printed circuit board of flex-rigid type, a first rigid portion of the third board comprising the first board, a second rigid portion of the third board comprising the second board, and a flexible portion of the third board comprising said conductors.

According to an embodiment, the walls are insulating and the electric conductors comprise electrically-conductive vias arranged in said walls.

According to an embodiment, said chip comprises at least one pixel and the device comprises a first opening crossing the second printed circuit board opposite said at least one pixel, the first opening emerging into the first cavity.

According to an embodiment: said walls further define a second cavity between the first and second printed circuit boards and optically isolate the first cavity from the second cavity; the device comprises a light source resting on the first surface of the first board in the second cavity and being electrically connected to the conductive tracks of the first surface of the first board; and the device comprises a second opening crossing the second printed circuit board opposite said light source, the second opening emerging into the second cavity.

According to an embodiment, the integrated circuit chip extends through said walls all the way into the second cavity and comprises at least one additional pixel in the second cavity.

According to an embodiment, the device comprises an optical device provided with at least one conductive trace, said optical device resting against the second printed circuit board to close the second opening, and being electrically connected to conductive tracks of the second printed circuit board.

According to an embodiment, the second printed circuit board comprises a second surface opposite to its first surface, said second surface being provided with conductive tracks electrically coupled to the conductive tracks of the first surface of the second board by electrically-conductive vias extending between the first and second surfaces of the second board and, preferably, the second printed circuit board comprises no conductive track between its first and second surfaces.

According to an embodiment, the optical device rests on top of and in contact with the second surface of the second printed circuit board and is electrically connected to the conductive tracks of the second surface of the second board, for example, by conductive wires.

According to an embodiment, the optical device rests on top of and in contact with the first surface of the second printed circuit board and is electrically connected to the conductive tracks of the first surface of the second board, for example, by conductive wires.

According to an embodiment, the device comprises a cover resting on the second board, on a side opposite to the first surface of the second board, the cover being provided with a first window opposite the first opening.

According to an embodiment, the device comprises a cover resting on the second board, on a side opposite to the first surface of the second board, the cover being provided with a first window opposite the first opening and with a second window opposite the second opening, the cover preferably comprising a partition configured to optically isolate a cavity extending between the first window and the first opening of a cavity extending between the second window and the second opening.

According to an embodiment, the device comprises: a first cover resting on the second board, on a side opposite to the first surface of the second board, the first cover comprising a first window opposite the first opening; and a second cover resting on the second board, on a side opposite to the first surface of the second board, the second cover comprising a second window opposite the second opening.

An embodiment provides a time-of-flight sensor comprising a device such as described hereabove.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
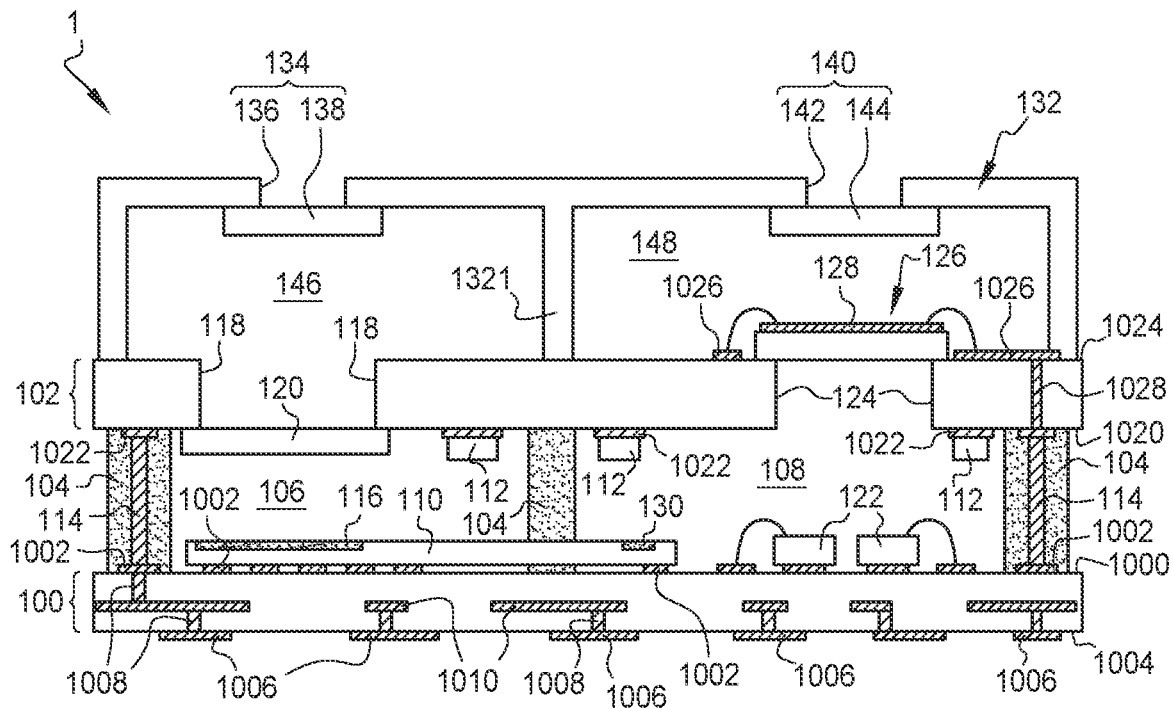
FIG. 1 schematically shows in a cross-section view an example of embodiment of a time-of-flight sensor.

FIG. 1 schematically shows in a cross-section view an example of embodiment of a time-of-flight sensor 1.

Sensor 1 comprises a printed circuit board (PCB) 100 and a printed circuit board 102.

A surface 1000 of board 100, that is, the upper surface in the orientation of FIG. 1, comprises conductive tracks 1002.

Board 100 comprises a surface 1004 opposite to surface 1000, this surface 1004 corresponding to the lower surface of board 100 in the orientation of FIG. 1.

Preferably, as shown in FIG. 1, the surface 1004 of board 100 comprises conductive tracks 1006. These tracks 1006 are connected to tracks 1002 via conductive vias 1008 of board 100. As an example, these vias 1008 extend vertically through board 100, that is, along a direction orthogonal to surfaces 1000 and 1004 of board 100.

As an example, tracks 1006 enable to electrically connect device 1 when it is mounted on, or assembled with, a printed circuit board, for example, by soldering conductive tracks 1006 to corresponding conductive tracks of the printed circuit board having device 1 mounted thereon.

As an example, board 100 may comprise one or a plurality of levels of conductive tracks between its surfaces 1000 and 1004, for example one conductive track level 1010 as shown in FIG. 1. These conductive track levels are connected to tracks 1002 and 1006 using the vias 1008. In other examples, not shown, board 100 does not comprise conductive track level 1010 between its surfaces 1000 and 1004 or, conversely, comprise more than one conductive track level 1010 between its surfaces 1000 and 1004.

A surface 1020 of board 102, that is, the lower surface in the orientation of FIG. 1, comprises conductive tracks 1022.

Surface 1000 of board 100 faces, or is in front of, surface 1020 of board 102. Preferably, surfaces 1000 and 1020 are substantially parallel.

Board 102 comprises a surface 1024 opposite to surface 1020, this surface 1024 corresponding to the upper surface of board 102 in the orientation of FIG. 1.

In the embodiment illustrated in FIG. 1, surface 1024 of board 102 comprises conductive tracks 1026. These tracks 1026 are connected to tracks 1022 via conductive vias 1028 of board 102. As an example, these vias 1028 extend vertically through board 102, that is, along a direction orthogonal to the surfaces 1020 and 1024 of board 102.

Preferably, board 102 does not comprise a conductive track level between its surfaces 1020 and 1024, which enables to limit the complexity and the cost of this board 102 and of device 1. However, in other examples, at least one conductive track level may be provided in board 102, between its surfaces 1020 and 1024. In this case, this or these conductive track level(s) are connected together and to tracks 1022 and 1026 via vias 1028.

Preferably, boards 100 and 102 are rigid PCBs. In other words, each of boards 100 and 102 is rigid, that is, it is not meant to be deformed. As an example, as usual for a rigid PCB, each board 100 and 102 has the shape of a substantially planar plate.

Device 1 further comprises walls or partitions 104. The walls 104 couple boards 100 and 102 together. For example, walls 104 extend in height (or vertically) from one to the other of boards 100 and 102, along a direction orthogonal to boards 100 and 102, for example, a direction orthogonal to surfaces 1000, 1004, 1020, and 1024. In other words, walls 104 have a base in contact with board 100 and a top in contact with board 102.

Preferably, walls 104 are electrically and optically insulating. In other words, the walls are made of one or a plurality of electrically-insulating materials which do not give way to light.

Walls 104 define a cavity 106 between boards 100 and 102, for example, between the surfaces 1000 and 1020 of boards 100 and 102. In other words, walls 104 form, between boards 100 and 102, a ring laterally delimiting cavity 106, this cavity 106 being vertically delimited by boards 100 and 102.

Preferably, walls 104 ensure a mechanical function, that is, the assembly of board 100 to board 102.

Preferably, all or part of walls 104 are arranged along the entire periphery of board 100 and of board 102 when the boards have substantially identical dimensions. According to another example, all or part of walls 104 are arranged along the entire periphery of the smallest one of boards 100 and 102 when one of the two boards is smaller than the other.

Device 1 comprises an integrated circuit chip 110, that is, for example, a portion of a semiconductor wafer having integrated electronic circuits and structures of interconnection of these circuits together and to connection pads of the chip formed inside and on top of it.

Chip 110 is arranged in cavity 106. Chip 106 rests on surface 1000 of board 100. Chip 110 is electrically connected to conductive tracks 1002. For example, in FIG. 1, chip 110 is directly mounted on conductive tracks 1002 (in a front-side down or flip-chip orientation), for example by soldering contact pads (not shown) of chip 110 to tracks 1002. In another example, not illustrated, chip 110 may be assembled on surface 1000, for example, glued to this surface 1000 (in a front-side up orientation), and be connected to the tracks by conductive wires, that it, by wire bonding.

Device 1 further comprises various electronic components 112, for example resistors, inductances, and/or capacitors. These components 112 are implemented outside of chip 110. These components are surface mounted components (SMC). Components 112 rest on top of and in contact with the conductive tracks 1022 of board 102. Components 112 may also be arranged on top of and in contact with conductive tracks 1002 of board 100 as shown in FIG. 1, and/or be arranged on top of and in contact with the conductive tracks 1026 of board 102, although this is not the case in FIG. 1.

Device 1 further comprises electric conductors 114 electrically connecting board 100 to board 102.

According to an embodiment, as illustrated in FIG. 1, conductors 114 comprise or correspond to electrically-conductive vias 114 arranged in walls 104, that is, in at least some of walls 104. Vias 114 extend in height (or vertically) in a direction orthogonal to boards 100 and 102, for example, in a direction orthogonal to surfaces 1000 and 1002. Vias 114 cross walls 104, where they are arranged all along their height. As indicated hereabove, vias 114 electrically connect boards 100 and 102, that is, the conductive tracks of board 100 to the conductive tracks of board 102. For example, these vias 114 extend from a conductive track 1002 of surface 1000 of board 100 to a conductive track 1022 of surface 1020 of board 102.

The two boards 100 and 102 and walls 104 form a package having chip 110 and the components 112 of device 1 arranged therein. The provision of conductors 114 enable to electrically couple components 112 mounted on board 102, for example, on surface 1020 of board 102, and chip 110 assembled on board 100. As compared with a device where walls 104 and board 102 would have been replaced with an insulating cover forming a package with board 100, device 1 is more compact. This results from the fact that, in device 1, at least some of components 112 are assembled on board 102, for example on surface 1020 of board 102. This is true whether device 1 is a time-of-flight sensor or any other electronic device comprising electronic components and an integrated circuit chip electrically coupled together and mounted in a package.

In the example of embodiment of FIG. 1, device 1 is a time-of-flight sensor. In this example of embodiment, chip 110 then comprises at least one pixel configured to receive light. For example, chip 110 comprises a pixel array 116. As an example, the pixels of array 116 are arranged to face board 102.

For the pixels array 116 to be able to receive light, board 102 then comprises an opening 118 opposite the pixels of array 116. Opening 118 emerges into cavity 106, where the pixels of array 116 are arranged.

Preferably, a passive optical device 120 such as a lens, a transparent plate, or a filter, for example, an interferometric filter, may be arranged so as to close opening 118 or, in other words, so as to close cavity 106 at the level of this opening 118. Optical device 120 is called passive in that it requires no electric connection, that is, it only implements a purely optical function. As an example, optical device 120 is maintained rigidly attached to board 102, for example, by glue.

According to an embodiment, as illustrated in FIG. 1, device 120 has dimensions greater than those of opening 118 and rests, for example, at the level of its periphery, on surface 1020 of board 102. According to another embodiment not shown, device 120 has dimensions greater than those of opening 118 and rests, for example, at the level of its periphery, on surface 1024 of board 102. According to still another embodiment, not illustrated, device 120 has the same dimensions as opening 118 and is arranged in opening 118, between surfaces 1020 and 1024.

In this example where device 1 is a time-of-flight sensor, as illustrated in FIG. 1, walls 104 define a further cavity 108 between boards 100 and 102, for example, between surfaces 1000 and 1020 of boards 100 and 102. In other words, walls 104 form, between boards 100 and 102, a ring laterally delimiting cavity 108, this cavity 108 being vertically delimited by boards 100 and 102. Further, walls 104 optically isolate cavity 106 from cavity 108.

Time-of-flight sensor 1 comprises at least one light source 122, for example two light sources 122. Each light source 122 is for example a laser of VCSEL ("vertical-cavity surface-emitting laser") type.

Each light source 122 rests on surface 1000 of board 100, in cavity 108.

Due to the fact that light source(s) 122 are arranged in cavity 108 while the pixels of array 116 of chip 110 are arranged in cavity 106, and walls 104 electrically insulate cavities 106 and 108 from each other, the light emitted by each light source 122 cannot directly reach the pixels of array 116.

To be electrically powered, each light source 122 is connected to the conductive tracks 1002 of board 100.

In the example illustrated in FIG. 1, each light source 122 rests on a conductive track 1002, so that a contact pad (not illustrated) of light source 122 is electrically connected to this track 1002, for example, via a soldering. Further, still in the example of FIG. 1, each light source 122 comprises a contact pad (not shown) arranged on a surface of light source 122 which is opposite to the surface in contact with track 1002. This other contact pad is connected to another track 1002 of board 102 by a conductive wire, that is, by wire bonding.

However, the present description is not limited to this specific example of connection of each light source 122 to the conductive tracks 1002 of board 102. For example, each source 122 may be connected to tracks 1002 only by wire bonding or only by soldering of its contact pads to tracks 1002.

Each light source 122 is electrically connected to chip 110 and/or to components 112 via the conductive tracks of board 100 and/or conductors 114 and/or conductive tracks of board 102.

For the light sources 122 of time-of-flight sensor 1 to be able to emit light towards a scene to be captured, board 102 then comprises an opening 124 opposite light source(s) 122. Opening 124 emerges into cavity 108.

Similarly to what has been described for opening 118, a passive optical device may be arranged to close cavity 108 at the level of opening 124.

According to an embodiment, as illustrated in FIG. 1, an active optical device 126 is arranged to close cavity 108 at the level of opening 124. Device 126 is called active in that it comprises electric connection pads, that is, in that it implements at least one electric function, as opposed to device 120 which requires no power supply and only implements a purely optical function.

In the illustrated embodiment, device 126, for example, an optical diffuser or a transparent plate, is provided with at least one conductive trace 128. Such an optical device 126 is for example configured to detect, based on variations of the value of the resistance of conductive trace 128, whether the light which is emitted by sources 122 is harmless for a user when it comes out of device 1 towards a scene to be captured.

Device 126 is arranged, or rests, against board 102, to close opening 124, or, in other words, to close cavity 108 at the level of this opening 124. Device 126 thus has dimensions greater than those of opening 124.

Further, device 126, for example, its conductive track(s) 128, is electrically connected to the conductive tracks of board 102. Thus, device 126 may be electrically coupled or connected to other electronic elements of device 1, for example to chip 110 and/or to light sources 122.

In the example of embodiment illustrated in FIG. 1, device 126 rests, for example, at the level of its periphery, on top of and in contact with the surface 1024 of board 102. In this example, device 126 is connected to the tracks 1026 of board 102, by conductive wires, that is, by wire bonding.

According to an embodiment, chip 110 may extend through walls 104 which separate cavity 106 from cavity 108, that is, through walls 104 which optically isolate cavity 106 from cavity 108, all the way into cavity 108. As an example, the portion of chip 110 which is located in cavity 108 comprises at least one additional pixel 130. Pixel 130 can then directly receive the light emitted by light sources 122 and may, for example, be used as a reference pixel. According to an alternative embodiment, chip 110 does not extend all the way to cavity 108.

According to an embodiment, as illustrated in the example of FIG. 1, device 1 further comprises a cover 132. Cover 132 rests on top and in contact with the surface 1024 of board 102. Cover 132 comprises a window 134 opposite (or in front of) opening 118. Window 134 comprises an opening 136 through cover 132, opposite opening 118, and a passive optical device 138 closing opening 136. As an example, optical device 138 is maintained rigidly attached to cover 132, for example, by glue.

In the example of FIG. 1, device 138 has dimensions greater than those of opening 136 and rests, for example, at the level of its periphery, on top of and in contact with cover 132. For example, device 138 rests on top of and in contact with a surface of cover 132 which faces board 102 as shown in FIG. 1. According to another example, not shown, device 138 rests on top of and in contact with a surface of cover 132 which faces the outside of device 1.

In another example, not illustrated, device 138 has the same dimensions as opening 136 and is arranged in opening 136, at an intermediate level between the level of the surface of cover 132 facing the outside and the level of the surface of the cover facing board 102.

In the embodiment illustrated in FIG. 1, cover 132 further comprises a window 140 opposite (or in front of) opening 124. Window 140 comprises an opening 142 through cover 132, opposite opening 124, and a passive optical device 144 closing opening 142. As an example, optical device 144 is maintained rigidly attached to cover 132, for example, by glue.

Similarly to what has been indicated for device 138 and opening 136, device 144 may have dimensions greater than those of opening 142 and rest on top of and in contact with the surface of cover 132 which faces board 102 (as is the case in FIG. 1) or on top of and in contact with the surface of cover 132 which faces the outside of device 1. Device 144 may thus have dimensions similar or equal to that of opening 142 and be arranged in opening 142, between the surface of cover 132 which faces the outside, and the surface of cover 132 which faces board 102.

Preferably, cover 132 comprises a partition 1321 configured to optically isolate a cavity 146 extending between window 134 and the opening 118 of a cavity 148 extending between window 140 and opening 124. This enables to avoid for the light emitted by light sources 122 and coming out of opening 124 to be reflected by cover 132 towards opening 118, which would disturb the time-of-flight measurement.

Figure 2:
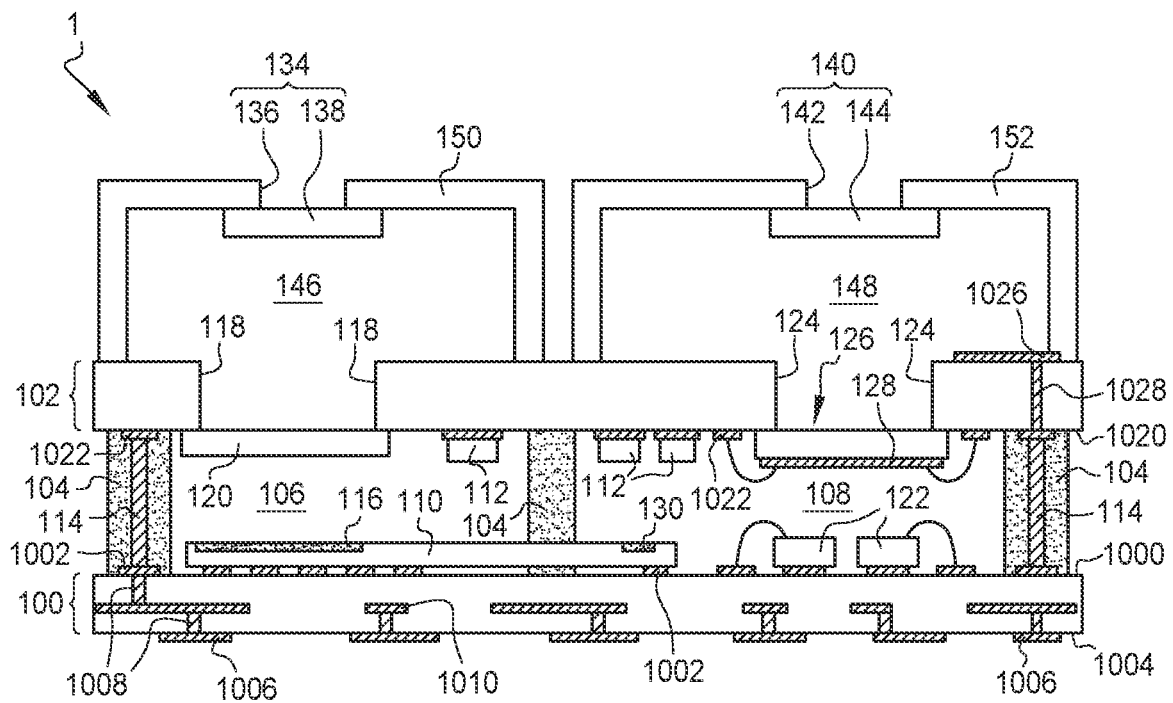
FIG. 2 schematically shows in a cross-section view an example of an alternative embodiment of the sensor of FIG. 1.

FIG. 2 schematically shows in a cross-section view an example of an alternative embodiment of the sensor 1 of FIG. 1.

Only the differences between the sensor of FIG. 1 and that of FIG. 2 are here highlighted.

A difference of the sensor 1 of FIG. 2 with respect to that of FIG. 1 is that its device 126, which is arranged against board 102 to close opening 124, rests on top of and in contact with surface 1020 of board 102, for example, at the level of its periphery. In this example, device 126 is electrically connected to board 102, for example, to the tracks 1022 of board 102, by conductive wires, that is, by wire bonding.

As an example, when device 126 is connected to conductive tracks 1022, in addition to comprising no conductive track level between its surfaces 1020 and 1024, surface 1024 of board 102 may comprise no conductive tracks 1026, which enables to decrease the cost and the complexity of board 102 and of device 1. However, in other examples, board 102 comprises tracks 1026 and may comprise at least one conductive track level between its surfaces 1020 and 1024.

Another difference of the sensor 1 of FIG. 2 with respect to that of FIG. 1 is that it comprises a cover 150 and a cover 152 to replace cover 132.

Cover 150 rests on top of and in contact with surface 1024 of board 102. Cover 150 comprises, similarly to cover 132, a window 134 opposite (or in front of) opening 118. Window 134 comprises an opening 136 through cover 150, opposite opening 118, and a passive optical device 138 closing opening 136. As an example, optical device 138 is maintained rigidly attached to cover 150, for example by glue. The way in which device 138 is arranged relative to cover 150 is similar to what has been described for the arrangement of device 138 relative to cover 132, where device 138 may rest on a surface of cover 150 facing the outside of device 1, on a surface of cover 150 facing board 102, or in opening 136. Cover 150 defines a cavity 146 above opening 118. Device 138 closes this cavity 146.

Cover 152 rests on top of and in contact with the surface 1024 of board 102. Cover 152 comprises, similarly to cover 132, a window 140 opposite (or in front of) opening 124. Window 140 comprises an opening 142 through cover 152, opposite opening 124, and a passive optical device 144 closing opening 142. As an example, optical device 144 is maintained rigidly attached to cover 152, for example by glue. The way in which device 144 is arranged relative to cover 152 is similar to what has been described for the arrangement of device 144 relative to cover 132, where device 144 may rest on a surface of cover 152 facing the outside of device 1, on a surface of cover 152 facing board 102, or in opening 144. Cover 152 defines a cavity 148 above opening 124. Device 144 closes cavity 148.

Preferably, covers 150 and 152 are configured to optically isolate a cavity 146 extending between window 134 and the opening 118 of cavity 148 extending between window 140 and opening 124. This enables to avoid for the light emitted by light sources 122 and coming out of opening 124 to be reflected by one or the others of covers 150 and 152 towards opening 118, which would disturb the time-of-flight measurement.

The various examples of implementation details described in relation with FIG. 1 apply to the device 1 of FIG. 2. Further, it will be within the abilities of those skilled in the art to provide a device 1 where device 126 rests on surface 1024 of board 102 as described in relation with FIG. 1, when device 1 comprises two covers 150 and 152 as described in relation with FIG. 2.

Figure 3:
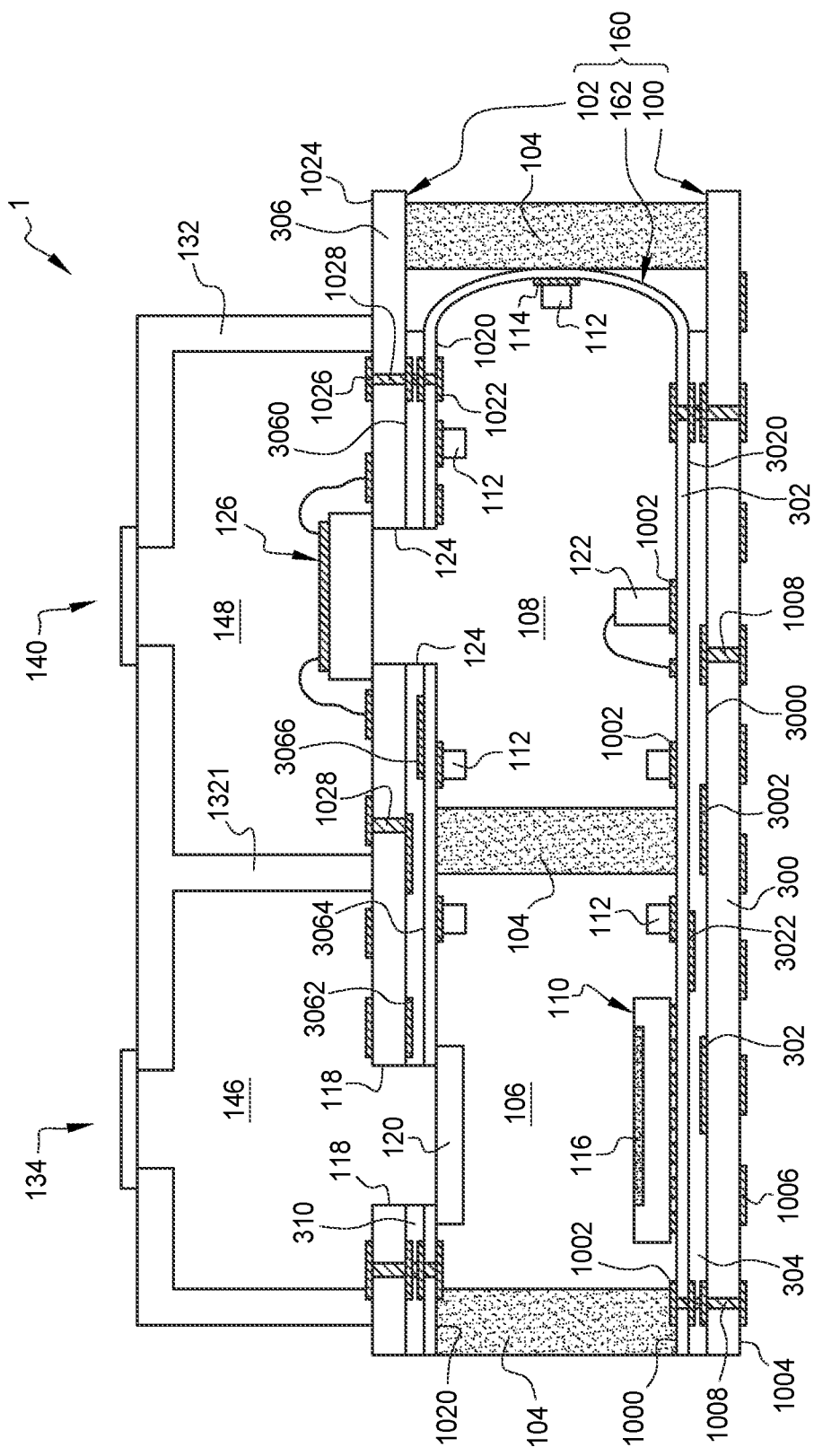
FIG. 3 schematically shows in a cross-section view an example of another alternative embodiment of the sensor of FIG. 1.

FIG. 3 schematically shows in a cross-section view an example of another alternative embodiment of the sensor 1 of FIG. 1. Only the differences between the device 1 of FIG. 3 and that of FIG. 1 are here highlighted.

In this variant, device 1 comprises a flex-rigid PCB-type printed circuit board 160.

Board 160 comprises, as usual for a flex-rigid PCB: a rigid portion, that is, a rigid printed circuit board, which corresponds to, or comprises, board 100; another rigid portion, that is, another rigid printed circuit board, which corresponds to, or comprises, board 102; and a flexible portion 162, that is, a flexible printed circuit board, which electrically connects portions 100 and 102 to each other.

In particular, in this variant, conductors 114 are no longer electrically-conductive vias extending in walls 104, but conductive tracks 114 of the flexible portion 162 of board 160.

The flexible portion 162 of board 160 extends from one to the other of rigid boards 100 and 102, along walls 104. Thus, conductors 114 extend along walls 104. In other words, flexible portion 162 extends from one to the other of boards 100 and 102, according to a curved shape comprising a portion substantially orthogonal to boards 100 and 102 which is arranged close to walls 104, for example, less than 50 μm away from walls 104, or which is in contact with walls 104, for example, glued to a wall 104.

As an example, the flexible portion 162 of board 160 comprises at least a portion of a flexible insulating layer, for example, a single flexible layer 302, having another portion belonging to board 100 or also another portion belonging to board 102.

In the example of embodiment of FIG. 3, the flexible portion 162 of board 160 is arranged between boards 100 and 102, in a cavity laterally delimited by walls 104, for example in cavity 108, although this flexible portion 162 may, in another example, be arranged in cavity 106. As an example, components 112 may be assembled, for example soldered, to the conductors 114 of the flexible portion 162 of board 160.

PCB boards of flex-rigid type are well known by those skilled in the art, and the implementation of board 160 in the device 1 of FIG. 3 is within the abilities of those skilled in the art. However, as an illustration only, a detailed implementation of board 160 is shown in FIG. 3. More particularly, in FIG. 3, board 100 comprises a rigid layer 300 having a surface (the lower surface in FIG. 3) which corresponds to the surface 1004 of board 100 and which comprises conductive tracks 1006. Layer 300 comprises a surface 3000 opposite to surface 1004 which comprises conductive tracks 3002, the latter forming a conductive track level between surfaces 1000 and 1004 of board 100. Board 100 further comprises a portion of flexible layer 302. This layer portion 302 has a surface (the upper surface of in FIG. 3) which corresponds to surface 1000 of board 100 and which comprises conductive tracks 1002. This layer portion 302 comprises a surface 3020 opposite to surface 1000 which comprises conductive 3022, the latter forming another conductive track level between surfaces 1000 and 1004 of board 100. The portion of layer 302 which belongs to board 100 is assembled on the layer 300 of board 100 by a glue layer 304. Similarly, in FIG. 3, board 102 comprises a rigid layer 306 having a surface (the upper surface in FIG. 3) which corresponds to the surface 1024 of board 102 and which comprises conductive tracks 1026. Layer 306 comprises a surface 3060 opposite to surface 1024 which comprises conductive tracks 3062, the latter forming a conductive track level between surfaces 1020 and 1024 of board 102. Board 102 further comprises a portion of flexible layer 302. This layer portion 302 has a surface (the lower surface in FIG. 3) which corresponds to the surface 1020 of board 102 and which comprises conductive tracks 1022. This layer portion 302 comprises a surface 3064 opposite to surface 1020 which comprises conductive tracks 3066, the latter forming another conductive track level between surfaces 1020 and 1024 of board 102. The portion of layer 302 which belongs to board 102 is assembled on the layer 306 of board 102 by a glue layer 310. Layer 302 further comprises, between its portion which belongs to board 100 and its portion which belongs to board 102, a portion which corresponds to the flexible portion 162 of board 160. In this example where flexible portion 162 is arranged in a cavity laterally delimited by walls 104, rigid layer 300 comprises an extension where layer 302 is not rigidly attached or glued to layer 300, and rigid layer 306 comprises an extension where layer 302 is not attached or glued to layer 306, the extensions of layers 300 and 306 being arranged in front of each other and the flexible portion 162 of board 160 being arranged between these two extensions. On the side of the extensions of respective layers 300 and 306, walls 104 which extend between the two boards 100 and 102 extend, for example, from the extension of layer 300 to the extension of layer 302, that is, between the surfaces 3000 and 3060 of respective layers 300 and 306.

The present description is not limited to the specific example of implementation of board 160 described hereabove. For example, each board 100 and 102 may comprise more than one rigid layer and/or flexible portion 162 may correspond to a portion of a stack of flexible layers. In the case where the flexible portion comprises a portion of a stack of flexible layers, this stack further comprising a portion belonging to board 100 and being, for example, glued to the rigid layer(s) of board 100, and a portion belonging to board 102 and being for example glued to the rigid layer(s) of board 102.

Another difference between the device 1 of FIG. 3 and that of FIGS. 1 and 2 is that chip 110 does not extend all the way to cavity 108. However, it will be within the abilities of those skilled in the art to provide such an extension of chip 110 all the way to the cavity 108 of the device 1 of FIG. 3 or, conversely, to modify the device 1 of FIGS. 1 and 2 so that chip 110 is totally comprised within cavity 106.

Although, in FIG. 3, device 126 rests on surface 1024 of board 102, it will be within the abilities of those skilled in the art to adapt the device 1 of FIG. 3 in the case where this device 126 rests on surface 1020 of board 102. Further, although, in FIG. 3, device 1 comprises a single cover 132, as described in relation with FIG. 1, it will be within the abilities of those skilled in the art to adapt the device 1 of FIG. 3 to the case where this device 1 comprises two distinct covers 150 and 152 as described in relation with FIG. 2. More generally, the various examples of implementation details described in relation with FIGS. 1 and 2 apply to the device 1 of FIG. 3.

Figure 4:
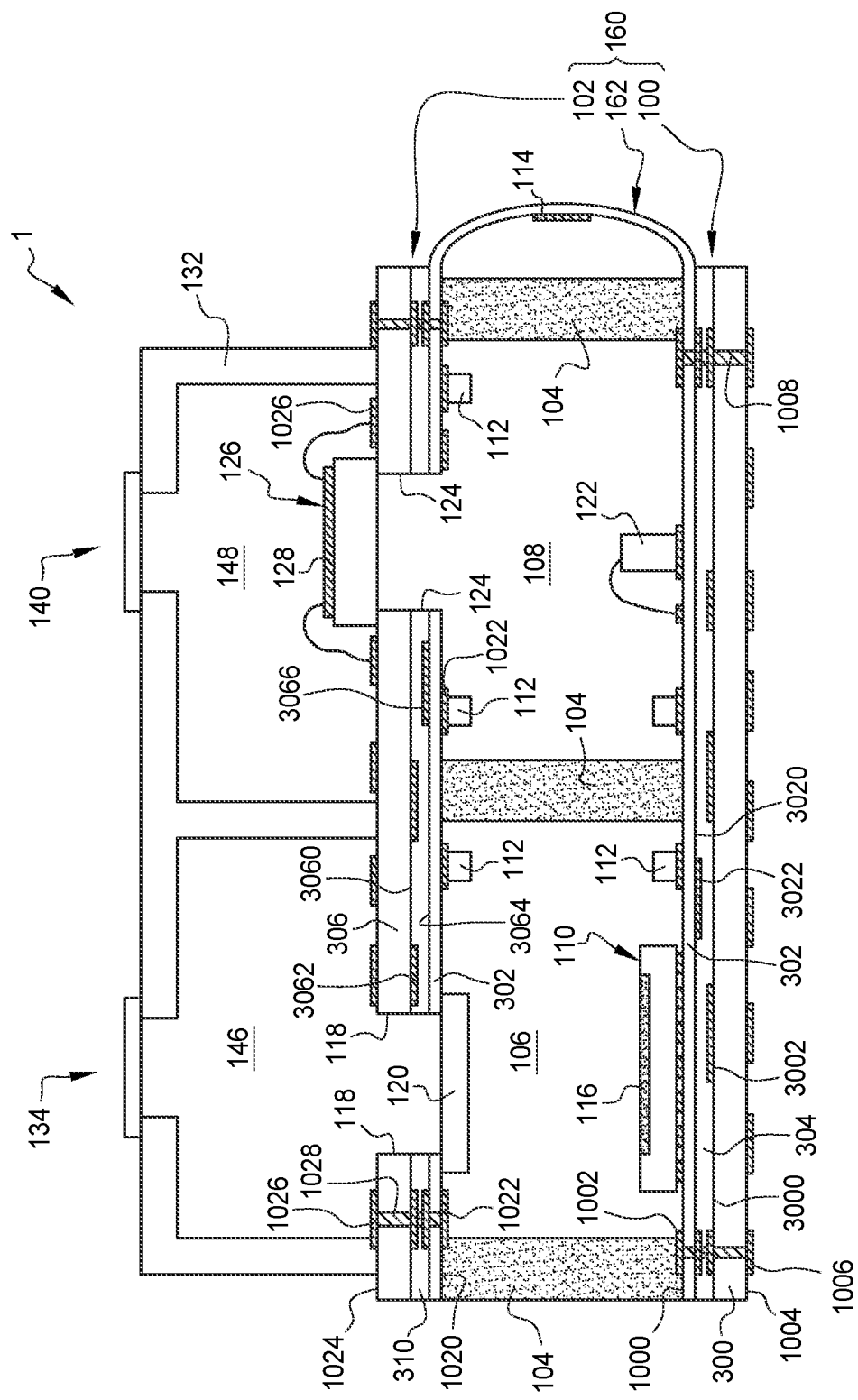
FIG. 4 schematically shows in a cross-section view an example of still another alternative embodiment of the sensor of FIG. 1.

FIG. 4 schematically shows in a cross-section view an example of still another alternative embodiment of the sensor 1 of FIG. 1. The sensor 1 of FIG. 4 comprises many elements in common with the sensor 1 of FIG. 3, and only the differences between these two sensors 1 are here highlighted.

In particular, as in FIG. 3, the device 1 of FIG. 4 comprises a printed circuit board 160 of flex-rigid type, board 160 comprising a rigid printed circuit board corresponding to or comprising board 100, a rigid printed circuit board corresponding to or comprising board 102 and a flexible printed circuit board 162. As in FIG. 3, the flexible portion 162 of board 160 extends from one to the other of rigid boards 100 and 102, along walls 104, and comprises electric conductors 114 which here correspond to conductive tracks of flexible printed circuit board 162.

However, conversely to the example of FIG. 3 where flexible portion 162 is arranged in a cavity extending between boards 100 and 102 and being laterally delimited by walls 104, in FIG. 4 this flexible portion 162 is not arranged between boards 100 and 102 or, in other words, is arranged in none of the cavities defined by walls 104 between boards 100 and 102. Still in other words, flexible portion 162 extends along walls 104, on one side of walls 104 which faces the outside of device 1.

The implementation of board 160 in the device 1 of FIG. 4 is within the abilities of those skilled in the art. However, for mere illustration purposes, a detailed implementation of board 160 is shown in FIG. 4. As compared with the detailed example described in relation with FIG. 3, in FIG. 4, rigid layer 300 comprises no extension where layer 302 is not rigidly attached or glued to layer 300, and rigid layer 306 comprises no extension where layer 302 is not rigidly attached or glued to layer 306.

Board 160 is easier to manufacture in the case of the embodiment of FIG. 4. However, in the embodiment of FIG. 4, flexible portion 162 is not as well protected as in the embodiment of FIG. 3 where it is inside of the package formed by boards 100 and 102 and walls 104.

The present description is not limited to the specific example of implementation of board 160 described hereabove in relation with FIG. 4. For example, each board 100 and 102 may comprise more than one rigid layer and/or flexible portion 162 may correspond to a portion of a stack of flexible layers. This stack of flexible layers then comprises another portion belonging to board 100 and being, for example, glued to the rigid layer(s) of board 100, and a still another portion belonging to board 102 and being for example glued to the rigid layer(s) of board 102.

Although, in FIG. 4, device 126 rests on surface 1024 of board 102, it will be within the abilities of those skilled in the art to adapt the device 1 of FIG. 4 in the case where this device 126 rests on surface 1020 of board 102. Further, although, in FIG. 4, device 1 comprises a single cover 132, as described in relation with FIG. 1, it will be within the abilities of those skilled in the art to adapt the device 1 of FIG. 4 to the case where this device 1 comprises two distinct covers 150 and 152 as described in relation with FIG. 2. More generally, the various examples of implementation details described in relation with FIGS. 1 and 2 apply to the device 1 of FIG. 4.

In FIGS. 1 to 4, device 126 is electrically connected to tracks 1026 (FIGS. 1, 3, and 4) or to tracks 1022 (FIG. 2) by wire bonding. As a variant, device 126 may be connected to these conductive tracks by soldering between contact pads of device 126 and these conductive tracks.

Further, although there has been described, in relation with FIGS. 1 to 4, a device 1 provided with a cover 132 or a plurality of covers 150, 152, in other examples, not shown, this or these cover(s) may be omitted. In this case, a protective layer may be directly arranged on surface 1024 of chip 102, for example, a layer made of a transparent material, for example, a resin, also covering openings 118 and 124 and devices 126 and 120, or a layer made of an opaque material, for example, a resin, comprising openings opposite openings 118 and 124.

It will be within the abilities of those skilled in the art to adapt the device 1 described in relation with FIGS. 1 to 4 to the cases where device 120 is replaced with an active optical device of the type of device 126 and/or device 126 is replaced with a passive optical device of the type of device 120.

The present description is not limited to the case where device 1 is a time-of-flight sensor. As an example, device 1 may correspond to a gas or smoke sensor having a light source 122 and a chip 110 comprising at least one pixel configured to receive the light emitted by source 122 after it has been reflected by a mirror. Device 1 is then configured to determine the absorption of light during its path outside of device 1, to determine a concentration rate of a gas or whether smoke is present. As other examples, device 1 is configured to detect the presence of an object, for example, an obstacle, or of a human presence, for example to detect a human face.

Further, according to the application implemented by device 1, the latter may comprise more than two cavities delimited vertically by boards 100 and 102 and laterally by walls 104, where each cavity may or not be provided with an opening emerging into the cavity. Conversely, device 1 may comprise a single cavity, for example, with no opening through board 102 or in the case of an application requiring no light emission or reception. Further, in each cavity of device 1, one or a plurality of integrated circuit chips may be provided, and certain cavities may comprise no integrated circuit chip.

Various embodiments and variants have been described. Those skilled in the art will understand that certain features of these various embodiments and variants may be combined, and other variants will occur to those skilled in the art. In particular, the embodiments and variants of FIGS. 1 and 2 where conductors 114 are vias arranged in walls 104 and the embodiments and variants of FIGS. 3 and 4 where conductors 114 are conductive tracks of flexible printed circuit board 162 can be combined. The device 1 thus obtained then comprises the two types of conductors 114, that is, the conductive tracks of board 162 and the conductive vias in walls 104.

Finally, the practical implementation of the described embodiments and variations is within the abilities of those skilled in the art based on the functional indications given hereabove.

The invention claimed is:
1. A device, comprising:
a first printed circuit board;
a second printed circuit board;
wherein the first printed circuit board comprises a first rigid portion of a flex-rigid type printed circuit board, the second printed circuit board comprises a second rigid portion of the flex-rigid type printed circuit board;

walls coupling the first printed circuit board to the second printed circuit board and defining a first cavity between said first and second printed circuit boards;

electric conductors associated with said walls, said electric conductors electrically connecting the first printed circuit board to the second printed circuit board, wherein a flexible portion of the flex-rigid type printed circuit board supports said electric conductors;

an integrated circuit chip supported by a first surface of the first printed circuit board in the first cavity, said integrated circuit chip electrically connected to conductive tracks of the first surface of the first printed circuit board; and surface-mounted components supported by and in contact with conductive tracks of a first surface of the second printed circuit board;

wherein the first surfaces of the first and second printed circuit boards face towards each other.

2. The device according to claim 1, wherein said integrated circuit chip comprises at least one pixel and wherein the second printed circuit board includes a first opening crossing the second printed circuit board opposite said at least one pixel, the first opening emerging into the first cavity.

3. The device according to claim 2, further comprising:

wherein said walls further define a second cavity between the first and second printed circuit boards and optically isolate the first cavity from the second cavity;

a light source resting on the first surface of the first printed circuit board in the second cavity, said light source electrically connected to the conductive tracks of the first surface of the first printed circuit board; and wherein the second printed circuit board includes a second opening crossing the second printed circuit board opposite said light source, the second opening emerging into the second cavity.

4. The device according to claim 3, further comprising an optical device configured to close the second opening, wherein the optical device includes at least one conductive trace electrically coupled to conductive tracks of the second printed circuit board.

5. The device according to claim 3, wherein the flexible portion of the flex-rigid type printed circuit board is positioned within one of the first and second cavities.

6. The device according to claim 3, wherein the flexible portion of the flex-rigid type printed circuit board is positioned outside each of the first and second cavities.

7. A time-of-flight sensor, comprising the device according to claim 1.

8. A device, comprising:

a first printed circuit board;

a second printed circuit board;

walls coupling the first printed circuit board to the second printed circuit board and defining a first cavity between said first and second printed circuit boards;

electric conductors associated with said walls, said electric conductors electrically connecting the first printed circuit board to the second printed circuit board;

an integrated circuit chip supported by a first surface of the first printed circuit board in the first cavity, said integrated circuit chip electrically connected to conductive tracks of the first surface of the first printed circuit board; and surface-mounted components supported by and in contact with conductive tracks of a first surface of the second printed circuit board;

wherein the first surfaces of the first and second printed circuit boards face towards each other;

wherein said integrated circuit chip comprises at least one pixel and wherein the second printed circuit board includes a first opening crossing the second printed circuit board opposite said at least one pixel, the first opening emerging into the first cavity.

9. The device according to claim 8, further comprising:

wherein said walls further define a second cavity between the first and second printed circuit boards and optically isolate the first cavity from the second cavity;

a light source resting on the first surface of the first printed circuit board in the second cavity, said light source electrically connected to the conductive tracks of the first surface of the first printed circuit board; and wherein the second printed circuit board includes a second opening crossing the second printed circuit board opposite said light source, the second opening emerging into the second cavity.

10. The device according to claim 9, wherein the integrated circuit chip extends through said walls between the first and second cavities and wherein the integrated circuit chip further comprises at least one additional pixel in the second cavity.

11. The device according to claim 9, further comprising an optical device resting against the second printed circuit board to close the second opening, wherein the optical device includes at least one conductive trace electrically connected to conductive tracks of the second printed circuit board.

12. The device according to claim 11, wherein the second printed circuit board comprises a second surface opposite to its first surface, with conductive tracks electrically on said second surface being coupled to the conductive tracks of the first surface of the second board by electrically-conductive vias extending between the first and second surfaces of the second printed circuit board.

13. The device according to claim 12, wherein the optical device rests on top of and in contact with the second surface of the second printed circuit board and is electrically connected to the conductive tracks of the second surface of the second board by conductive wires.

14. The device according to claim 11, wherein the optical device rests on top of and in contact with the first surface of the second printed circuit board and is electrically connected to the conductive tracks of the first surface of the second board by conductive wires.

15. The device according to claim 9, further comprising a cover resting on the second board, on a side opposite to the first surface of the second board, the cover being provided with a first window opposite the first opening and with a second window opposite the second opening, the cover comprising a partition configured to optically isolate a cavity extending between the first window and the first opening of a cavity extending between the second window and the second opening.

16. The device according to claim 9, comprising:

a first cover resting on the second board, on a side opposite to the first surface of the second board, the first cover comprising a first window opposite the first opening; and a second cover resting on the second board, on a side opposite to the first surface of the second board, the second cover comprising a second window opposite the second opening.

17. The device according to claim 8, further comprising a cover resting on the second board, on a side opposite to the first surface of the second board, the cover being provided with a first window opposite the first opening.

18. A time-of-flight sensor, comprising the device according to claim 8.

19. The device according to claim 8, wherein the walls are insulating and the electric conductors comprise electrically-conductive vias arranged in said walls.

20. The device according to claim 8, wherein each of the first and second printed circuit boards is rigid.

21. The device according to claim 8, wherein the first printed circuit board comprises a first rigid portion of a flex-rigid type printed circuit board, the second printed circuit board comprises a second rigid portion of the flex-rigid type printed circuit board, and wherein a flexible portion of the flex-rigid type printed circuit board supports said electric conductors.

\* \* \* \* \*